United States Patent
Ise et al.

(10) Patent No.: US 6,993,854 B2
(45) Date of Patent: Feb. 7, 2006

(54) CENTRIFUGAL DRYER, MANUFACTURING METHOD FOR SEMICONDUCTOR DEVICE AND SEMICONDUCTOR MANUFACTURING APPARATUS

(75) Inventors: Hirotoshi Ise, Hyogo (JP); Toshiki Oono, Hyogo (JP); Tatsuo Mizuno, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 10/131,246

(22) Filed: Apr. 25, 2002

(65) Prior Publication Data

US 2003/0051366 A1 Mar. 20, 2003

(30) Foreign Application Priority Data

Sep. 14, 2001  (JP) .................................... 2001-279279

(51) Int. Cl.
    *F26B 17/24*      (2006.01)

(52) U.S. Cl. ................ 34/58; 34/59; 34/312; 34/317; 73/572

(58) Field of Classification Search ............. 34/58, 34/59, 572, 312, 317; 494/10, 82, 7; 73/12.01, 73/584, 600, 587; 340/683

See application file for complete search history.

(56) References Cited

FOREIGN PATENT DOCUMENTS

| JP | 9-210973 | | 8/1997 |
|----|----------|---|--------|
| JP | 10-160563 | | 6/1998 |
| JP | 11-121430 | | 4/1999 |
| JP | 11-121430 A | * | 4/1999 |
| JP | 2000-353684 | | 12/2000 |
| JP | 2000-353684 A | * | 12/2000 |
| JP | 2000-353685 | | 12/2000 |
| KR | 1997-0009982 | | 3/1997 |

* cited by examiner

*Primary Examiner*—Henry Bennett
*Assistant Examiner*—Camtu Nguyen
(74) *Attorney, Agent, or Firm*—McDermott Will & Emery LLP

(57) ABSTRACT

A centrifugal dryer of the present invention includes: a chamber for performing drying processing for plural substrates; a cradle, installed inside chamber, and drying plural substrates by rotation driving in a state of being held therein; and an elastic wave sensor for detecting an elastic wave generating upon striking of a chip from plural substrates to said chamber during the processing therefor.

10 Claims, 5 Drawing Sheets

CENTRIFUGAL DRYER, MANUFACTURING METHOD FOR SEMICONDUCTOR DEVICE AND SEMICONDUCTOR MANUFACTURING APPARATUS

BACKGROUND OF THE INVENTION

1. Field of the Invention

The present invention relates to a centrifugal dryer and a semiconductor manufacturing apparatus, and more particularly, to a centrifugal dryer having a function to detect an elastic wave generating upon striking to a wall of a chamber of a chip produced by breakage of a substrate during a high speed rotation processing therefor to announce an anomaly, and to a semiconductor manufacturing apparatus equipped with said elastic wave detection system.

2. Description of the Background Art

There has been available an wet treatment apparatus as an apparatus performing removal of foreign matter attached on a substrate or a surface layer treatment with a sulfuric acid solution or a hydrogen peroxide solution in a semiconductor manufacturing process. After a treatment for the substrate with the wet treatment apparatus, a centrifugal dryer as one means drying the substrate has been widely used.

The centrifugal dryer rotates the substrate at high speed to remove residual liquid attached on the substrate and transports the stabilized substrate, thereby preventing liquid contamination in the next step.

However, since substrates are rotated at high speed, a substrate has a chance of breakage during the high speed rotation if a wound has been caused on the substrate, for example. Because of the breakage, not only do some other substrates receive damages, but some other substrates also receive wounds by residual chips thereon, which have imposed great inconvenience on semiconductor production.

In order to solve this problem, there have been available centrifugal dryers: one having means detecting an anomaly sound generating when a substrate is broken during a drying processing with a microphone and the other having anomaly sound detection means and vibration detection means detecting vibrations generating upon striking of a chip to a chamber wall, as disclosed in Japanese Patent Laying-Open No. 2000-353684, Japanese Patent Laying-Open No. 2000-353685 and Japanese Patent Laying-Open No. 11-121430 (1999).

In cases where an acoustic sensor such as a microphone and a vibration sensor as the vibration detection means, as described above, are adopted, the use has entailed following problem.

When an anomaly sound and an anomaly vibration generate upon striking of a chip, to a chamber wall, produced by breakage of a substrate, the anomaly sound is collected by an acoustic sensor mounted to an exhaust port cylinder or the like, and if a signal amplified by an amplifier exceeds a reference level set in advance, the signal is determined as an anomaly sound.

On the other hand, a vibrational wave generating upon striking of a chip produced by breakage of a substrate to a chamber wall or the like is detected by a vibration sensor provided on a chamber. The vibration sensor amplifies a voltage generated in a piezoelectric element by a vibrational wave at a prescribed amplification factor to output a voltage proportional to the time integral of an input voltage and to output a voltage proportional to a magnitude of an acceleration of a vibration, that is a voltage proportional to a magnitude of a speed of a vibration obtained by time integration of the acceleration.

Anomaly signals of an acoustic wave and a vibrational wave are detected by a sound-vibration detection section, for example, and determination and control are executed by a microcomputer. An anomaly vibration and an anomaly sound are discriminated through the determination and control.

Since the acoustic wave is, however, transmitted through the air, not only is a breakage sound of a substrate generating in a processing chamber collected, but various noises such as a rotation sound of a motor, a sound of opening/closing of a cover, a strainer sound and others are also collected.

If a centrifugal dryer is installed in a space under an environmental condition of silence, an acoustic wave associated with a breakage of a substrate can also be collected, but it cannot be guaranteed that generation of an acoustic wave of a like frequency in the vicinity of the breakage is always absent. Furthermore, even if a by-pass filter is provided in series with a circuit to limit a frequency to a specific one, there is still a fear to cause a wrong detection with respect to an anomaly sound.

Besides, since an installment place of an acoustic sensor is necessary to be selected in a processing chamber or inside an exhaust port cylinder in order to reduce a chance of wrong detection, difficulty arises in maintenance.

Detection of an anomaly using a vibrational wave has influences of noise from a spindle during rotation of a turn table and noise occurring upon opening/closing of a cover. In order to correct the noise, a necessity arises for processing signals of acceleration, stabilization and deceleration of the turn table with a microcomputer, necessitating a function of complex steps associated circuitry. Even with such a circuitry function including steps adopted, however, the vibration sensor collects noise as a matter of fact.

As described above, in a case where a prior art acoustic sensor or a prior art vibration sensor was employed, precision in error detection during processing for a substrate decreased due to inevitable detection of various kinds of noise and in addition, a necessity arose for a function of complex steps associated circuitry in order to correct noise, resulting in a problem of difficulty in error detection control.

SUMMARY OF THE INVENTION

It is accordingly an object of the present invention is not only to reduce detection of noise in processing of a substrate to facilitate error detection control but also to reduce wrong detection with respect to error.

A centrifugal dryer of the present invention includes: a chamber for performing drying processing for plural substrates; a rotary object, installed inside the chamber, and drying the plural substrates by rotation driving in a state of being held therein; and elastic wave detection means for detecting an elastic wave generating upon striking of a chip from the plural substrates to the chamber during the processing thereof.

With the elastic wave detection means provided, an elastic wave can be detected that is generated by striking to the chamber of a substrate chip produced by breakage of a substrate during the processing for the substrate. Thereby, it can be detected a fact that a chip of the substrate strikes the chamber.

A centrifugal dryer of the present invention preferably further includes means specifying the elastic wave. With the means provided, it can be specified whether or not a wave detected by the elastic wave detection means is an elastic wave, thereby enabling high precision detection of an anomaly.

The elastic wave detection means includes an elastic wave detection sensor. In this case, the elastic wave detection sensor is installed on an outside wall of the chamber. With this elastic wave detection sensor provided, an elastic wave can be detected that is generated by striking of a substrate chip to the chamber.

A centrifugal dryer of the present invention preferably further includes elastic wave detection frequency adjustment means adjusting a detection frequency for the elastic wave. With the means provided, only elastic waves with frequencies in the desired range can be detected and noise detection can be suppressed, thereby enabling high precision anomaly detection. For example, a detection frequency for the elastic wave may be variable in the range of from 50 kHz to 500 kHz, both limits included.

A detection frequency region for the elastic wave may be set in advance. By doing so, only an elastic wave in the desired frequency range can be detected, thereby enabling noise detection to be suppressed.

A centrifugal dryer of the present invention preferably includes an arithmetic-logic section inputted with a signal from the elastic wave detection means to output detection of an anomaly. With the section provided, a detection signal detected by the elastic wave detection means is inputted to the arithmetic-logic section to perform an operation in the arithmetic-logic section based on the detection signal, with the result that when an anomaly arises, an anomaly signal is inputted to a control section, thereby enabling controls of sections of the centrifugal dryer to be performed.

A centrifugal dryer of the present invention preferably includes announcement means announcing an error upon detection of an anomaly. With the means provided, a swift response can be performed upon the detection of an anomaly.

Furthermore, a centrifugal dryer of the present invention may include substrate processing interruption means for interrupting processing of the plural substrates upon detection of an anomaly. With the means provided, an adverse influence directed to the substrate in a later step can be blocked.

A manufacturing method for a semiconductor device of the present invention is characterized by performing drying processing for a substrate using the above centrifugal dryer. By doing so, detection of an anomaly during the drying processing for a substrate can be performed with high precision, thereby, enabling reduction in quality troubles.

A semiconductor manufacturing apparatus of the present invention includes: a chamber for performing processing for a substrate; substrate processing means, installed inside the chamber, and for performing the processing for a substrate; and elastic wave detection means for detecting an elastic wave generating upon striking of a chip of the substrate to the chamber during the processing for the substrate.

With the elastic wave detection means provided, striking of a substrate chip to the chamber during the processing of a substrate can be detected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given of embodiments of the present invention using FIGS. 1 to 5 below.

First Embodiment

Figure 1:
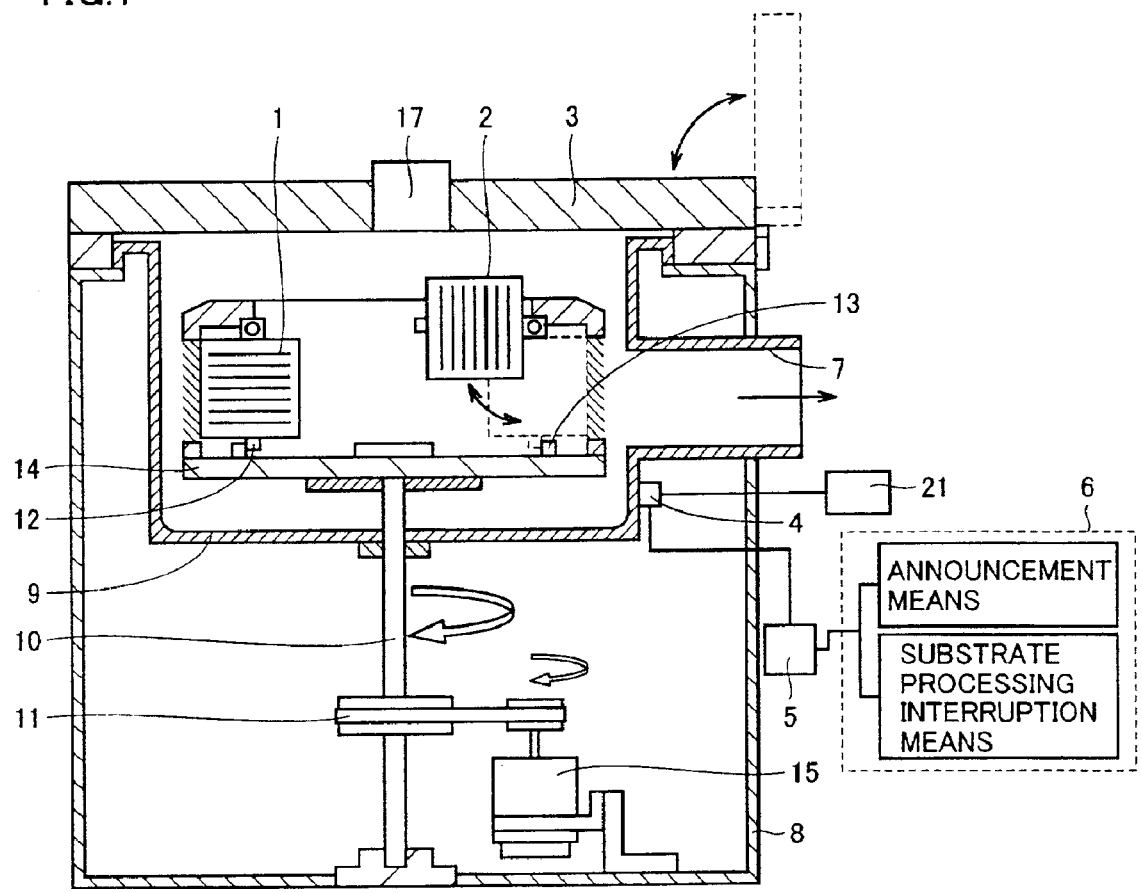
FIG. 1 is a sectional view of a centrifugal dryer of the present invention.

In FIG. 1, there is shown a centrifugal dryer or drying equipment in a first embodiment of the present invention. As shown in FIG. 1, the centrifugal dryer includes: an outside wall 8; a chamber 9 in the shape of a cylinder installed in outside wall 8; and a turn table 14 as a rotary object, installed in chamber 9, and freely rotatable along a horizontal plane.

Two cradles, for example, as members holding substrates (semiconductor substrates and so on) 1 such as silicon wafers (semiconductor wafers) are mounted in places on turn table 14 in the vicinity of the outer peripheral section thereof deviated from the rotation center thereof Cradles 2 are each freely rotatably supported by a shaft fixed to one end thereof, and positioned and held by a positioning metal piece 12 and a stopper plate 13. Furthermore, two cradles 2 are disposed in symmetry with respect to the rotation center of turn table 14.

Turn table 14 is mounted on the top end of a spindle 10. Spindle 10 is connected to a motor 15, whose rotation is controlled and for rotation driving, through a transmission belt 11 and rotation driven by motor 15.

A cover 3 opening/closing is disposed on chamber 9. Intake of the air into chamber 9 is done through an intake air port 17 provided in the central section of cover 3. On the other hand, the air already used for drying substrate 1, liquid, foreign matter and others in chamber 9 are guided to the outside through an opening formed in a side surface of chamber 9 and further discharged through an exhaust port cylinder 7.

Then, description will be given of an example operation of the centrifugal dryer. Cover 3 is opened by a cylinder (not shown) in such a manner as to be described with a dotted line. Spindle 10 stays at a low position most suitable for transportation of substrates 1, a cradle 2 is rotated so as to be open upward into a waiting state and thereafter, substrates 1, to be dried and from which foreign matter is to be removed, are accommodated into cradle 2.

After accommodation of substrates 1 is completed, cradle 2 is rotated downward and fixed at a predetermined position by positioning metal piece 12 and stopper plate 13. Thereafter, cover 3 is closed. Turn table 14 is rotation driven in this state. During this operation, a centrifugal force acts on substrates 1 and not only is a cleaning liquid attached thereto is scattered away as small drops therefrom, but the air also flows to and along surfaces of substrates 1 to enable substrates 1 to be dried.

Turn table 14 is ceased at the time when substrates 1 have been sufficiently dried. Then, cover 3 is opened to recover substrates 1 in cradle 2. Subsequent to this, substrates 1 are transported into an apparatus in which processing in the next step is performed, where substrates 1 are subjected to the processing in the next step. A semiconductor device are manufactured through many steps including the above drying step as a first step. Note that motor 15 rotation driving turn table 14 is of an inverter type and an electromagnetic force in a reverse direction is applied to turn table 14 in order to cease it.

While the above series of operations are performed in a case where no trouble occurs, there is another case where a substrate 1 is broken. In the latter case, a chip from substrate 1 produced by breakage thereof strikes a wall surface of chamber 9 and others to thereby generate an elastic wave.

In the present invention, it is an important feature to detect the elastic wave. That is, the elastic wave is detected with an elastic wave sensor 4 installed on the outside wall of chamber 9 to input a detection signal into an arithmetic-logic section 5. An operation is performed in arithmetic-logic section 5 based on the detection signal and in a case where an anomaly arises, an anomaly signal is inputted to a control section 6 to output an alarm and to cease turn table 14. Furthermore, with an alarm buzzer, and alarm lamp or the like, not shown, an operator is notified of the anomaly. That is, upon detection of an anomaly, controls of operations in sections of the centrifugal dryer are performed by control section 6 to interrupt the processing of substrates 1 and to, on the other hand, announce generation of the anomaly.

Herein, description will be given of an elastic wave sensor 4 of the present invention. Elastic wave sensor 4 of the present invention detects a wave with a relatively high frequency (for example, at least in the range of from 50 kHz to 500 kHz) from among vibrations transmitted through a solid mass and together with which the object in deformation gradually returns to the original state, thus positively using a speed at a resonance point, without having influences of miscellaneous mechanical sounds and noise in the surrounding environment.

Elastic wave sensor 4 used in execution of the present invention, dissimilar to an acceleration sensor using only an acceleration region under application of a damping effect of a dead weight on a piezoelectric element provided within the sensor to reduce a resonant frequency with the damping effect (a prior art vibration sensor), detects a vary small signal at a higher resonant frequency obtained by removal of the dead weight on the piezoelectric element, takes advantage of the resonant point positively and uses a speed as a main component.

Furthermore, since an elastic wave sensor 4 of the present invention detects a wave with a relative high frequency, sensor 4 also has a chance to detect a wave transmitted through a solid mass, which differentiates elastic wave sensor 4 from an acoustic sensor detecting a wave transmitted through gas in terms of an anomaly detection region.

Figure 6:
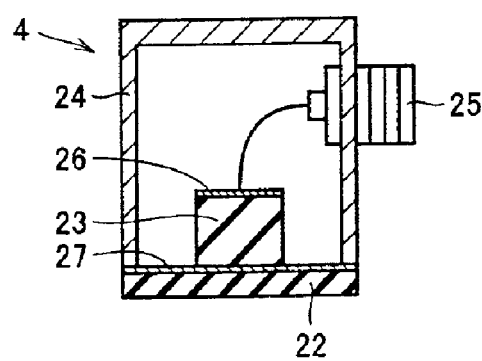
FIG. 6 is a sectional view showing an example structure of elastic wave sensor capable of being used in the present invention.

In FIG. 6, there is shown an example structure of an elastic wave sensor 4 that can be used in the present invention. An unbalanced elastic wave sensor 4 is shown in the example shown in FIG. 6.

As shown in FIG. 6, a wave receiving plate 22 is mounted to an end of a metal shield case 24. Wave receiving plate 22 is made of insulating material such as alumina and a silver vapor-deposited layer 27 is formed thereon. A lead zirconate titanate (PZT) 23, which is a piezoelectric element, is placed on silver vapor-deposited layer 27 and a silver vapor-deposited layer 26 is also formed on lead zirconate titanate 23. Then, a connector 25 mounted on shield case 24 is connected to silver vapor-deposited layer 26.

An elastic wave generated by striking of a chip of a substrate 1 to chamber 9 is transmitted to lead zirconate titanate 23 through wave receiving plate 22 and converted to an electric signal there; and thereafter the electric signal is sent to the outside through connector 25 and inputted to arithmetic-logic section (a measurement system) 5 through a preamplifier and a cable.

A centrifugal dryer of the present invention has means specifying an elastic wave. This means is included in the above arithmetic-logic section 5, for example. Setting is performed in advance such that a resonant point is obtained at least in the range of from 50 kHz to 500 kHz using a piezoelectric element detecting a very small signal without a dead weight that would otherwise be inserted in an elastic wave detection sensor. An intensity at the resonant point, for example, is inputted in analog form to arithmetic-logic section 5 and subjected to A/D conversion; and using a variable mechanism capable of adjusting sensitivity for a digital signal in the range of from 0 to 10 V to alter a threshold voltage, which becomes an error signal, in a variable manner, the error signal voltage is outputted to the main section of the centrifugal dryer. Furthermore, arithmetic-logic section 5 has a filtering function capable of cutting off a frequency region and extracts frequencies further specified in the range of from 50 kHz to 500 kHz using the filtering function to suppress noise, thereby enabling stable detection of an elastic wave generating upon striking of a chip from a substrate during the processing.

Alternatively, a centrifugal dryer of the present invention may be equipped with elastic wave detection frequency adjustment means 21 adjusting an elastic wave detection frequency. With elastic wave detection frequency adjustment means 21 provided, an elastic wave detection frequency may be variable in the range of from 50 kHz to 500 kHz, both limits included.

Still alternatively, in a centrifugal dryer of the present invention, an elastic wave detection frequency region may be set in advance. In order to set an elastic wave detection frequency region in advance, setting is performed in advance such that a resonant point is obtained at least in the range of from 50 kHz to 500 kHz using a piezoelectric element detecting a very small signal without a dead weight that would otherwise be inserted within an elastic wave detection sensor.

Second Embodiment

Figure 2:
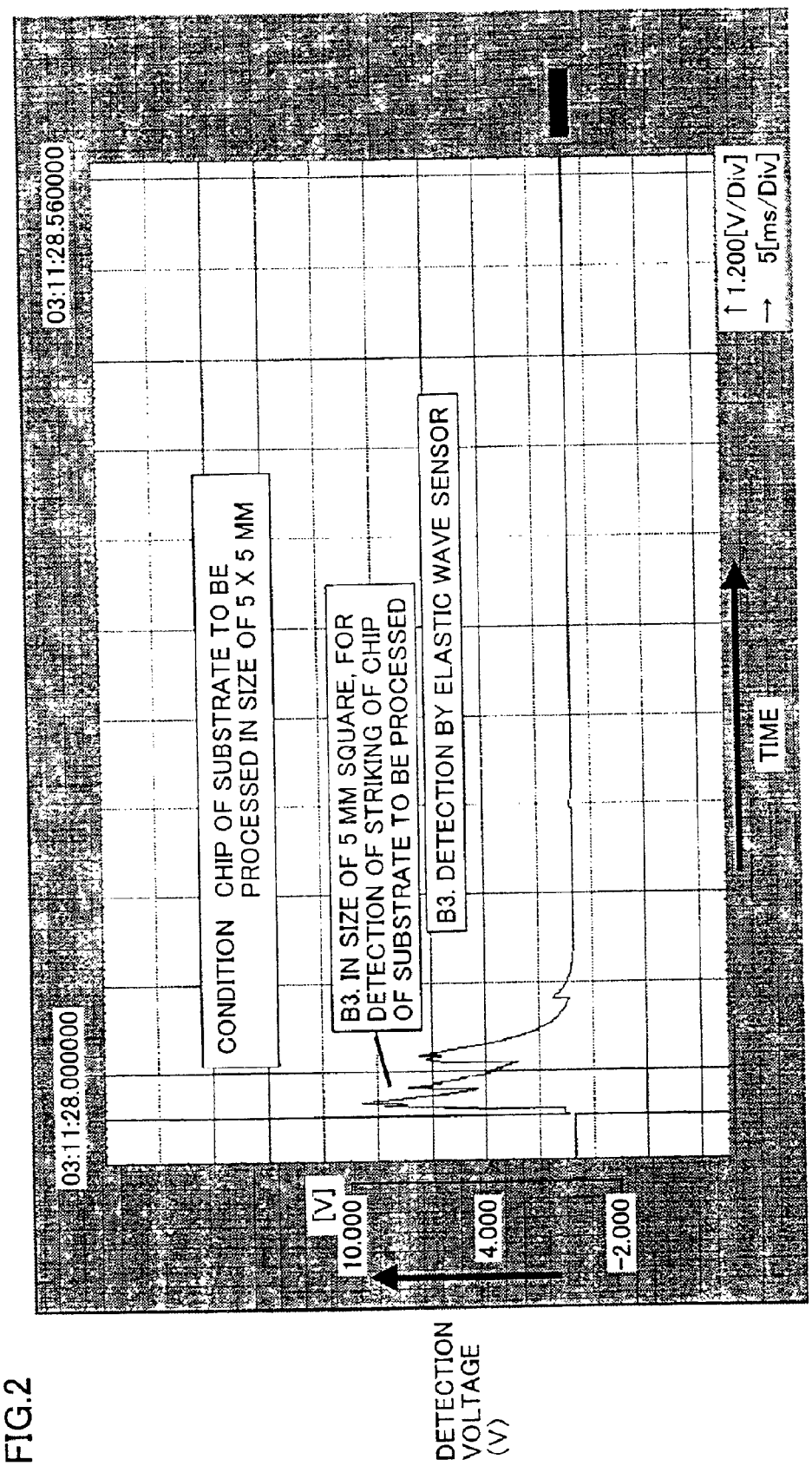
FIG. 2 is a graph showing an example of anomaly detection by an elastic wave sensor of the present invention.

In FIG. 2, there is shown an example of detection of an anomaly wave upon striking of a chip of a substrate 1 to chamber 9 in a centrifugal dryer according to the present invention.

FIG. 2 shows a detection voltage detected by an elastic wave sensor 4 of the present invention upon striking of a chip (5 mm square in size) produced from a substrate 1 during the processing in a centrifugal dryer according to the present invention shown in FIG. 1. In FIG. 2, the ordinate is assigned to a detection voltage and the abscissa is assigned to time, and a wave form B3 indicates a wave form from an elastic wave sensor.

As shown in FIG. 2, it is understood that the detection voltage value rises due to striking of the chip to chamber 9 to create a peak in the wave form from the elastic wave sensor. Thereby, striking of a chip of a substrate 1 to chamber 9 can be detected.

Third Embodiment

Figure 3:
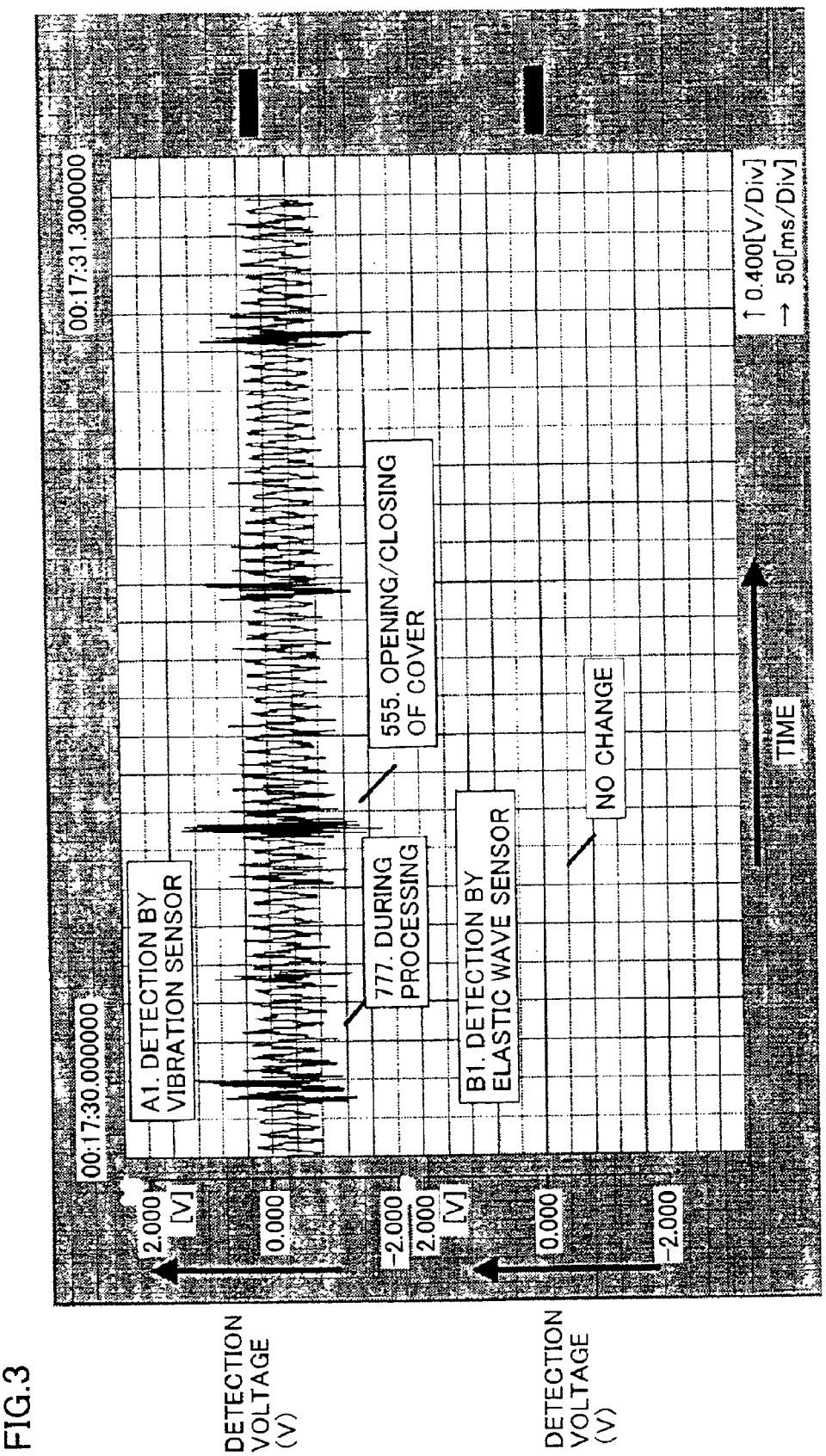
FIG. 3 is a graph comparing examples of detection by an elastic wave sensor and a vibration sensor of the present invention with each other.

In FIG. 3, there is shown results of detection of a vibrational wave and an elastic wave in a normal processing with an acceleration vibration sensor and an elastic wave sensor 4 of the present invention, respectively, installed in a centrifugal dryer according to the present invention.

In FIG. 3, a wave form A1 is a wave form from the acceleration vibration sensor and a wave form B1 is a wave form from the elastic wave sensor. In FIG. 3, the ordinate is assigned to a detection voltage and the abscissa is assigned to time. Detection time in the processing covered in each wave form measurement is similar to that in the other.

As is apparent from FIG. 3, while in the acceleration vibration sensor, noise is detected during processing (777) and upon opening/closing of a cover (555) both, in elastic wave sensor 4 of the present invention, no noise is detected.

This is because as described in the first embodiment, elastic wave sensor 4 of the present invention positively uses a speed at a resonant point having a relatively high frequency (for example, at least in the range of 50 kHz to 500 kHz) to detect waves without having influences of miscellaneous mechanical sounds and noise in the surrounding environment.

Therefore, according to the present invention, correction can be achieved on noise caused by spindle 10 during rotation of turn table 14 and on noise upon opening/closing of cover 3. Thereby, no necessity arises for a function of complex steps associated circuitry in processing signals of acceleration, stabilization and deceleration of turn table 14 in a microcomputer, which makes error detection control easy, thereby enabling of wrong detection of error to be suppressed.

Moreover, an elastic wave sensor 4 according to the present invention detects waves with relative high frequencies; therefore, a wave transmitted through a solid mass is detected, while no detection is achieved of noise transmitted through gas as done by an acoustic sensor to detect a wave transmitted through gas. Therefore, wrong detection with respect to noise can be effectively avoided, enabling high precision detection of an anomaly. As a result, machine related troubles can be quickly solved and an availability factor is ameliorated, thereby enabling a swift response to a quality trouble.

Fourth Embodiment

Figure 4:
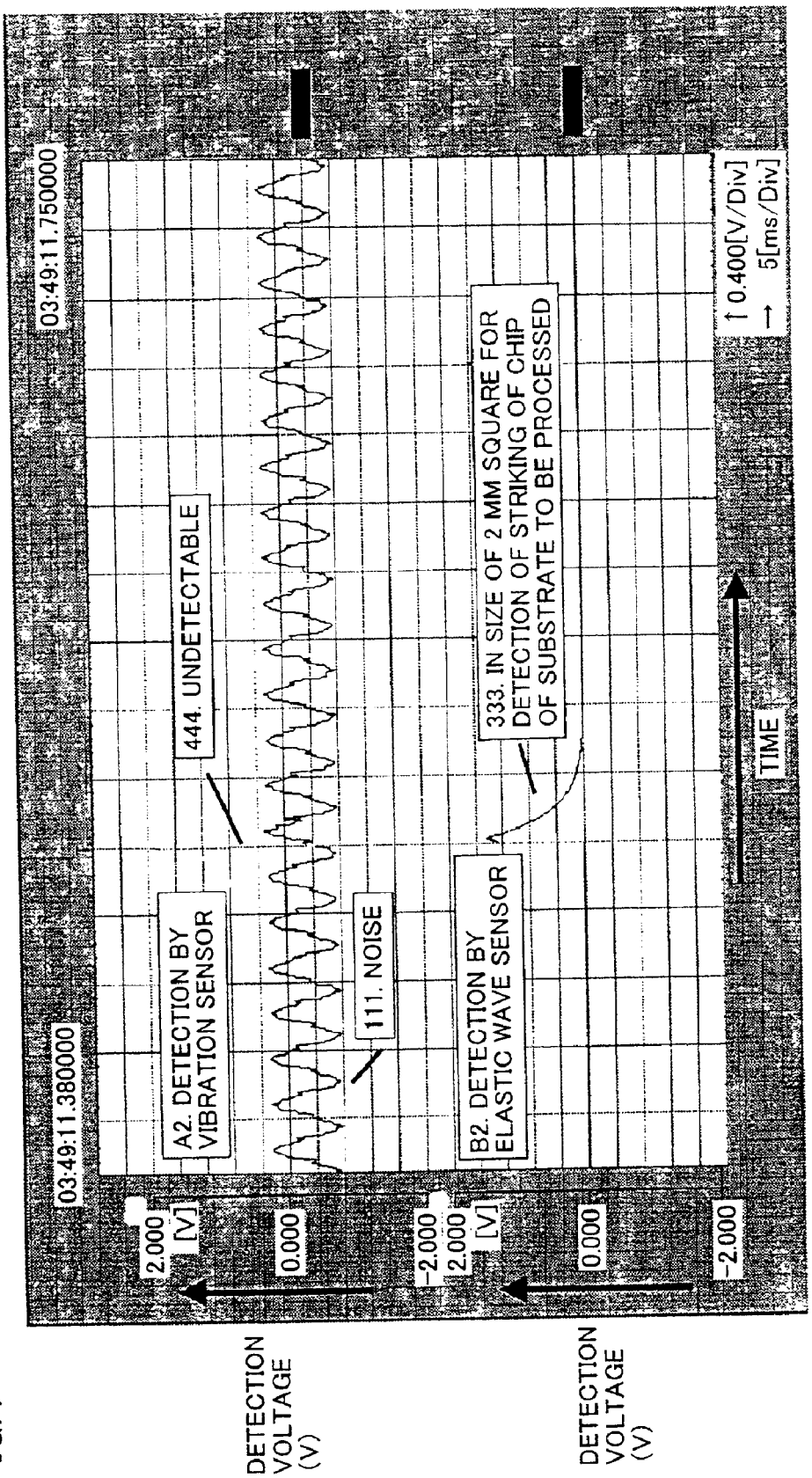
FIG. 4 is a graph comparing examples of anomaly detection by an elastic wave sensor and a vibration sensor of the present invention with each other.

In FIG. 4, there is shown results of detection of anomaly waves upon striking of a chip of a substrate 1 to chamber 9 in cases where an acceleration vibration sensor and an elastic wave sensor 4 of the present invention are installed in a centrifugal dryer of the present invention.

Note that a size of the chip was a square of 2 mm in one side. In FIG. 4, the coordinate is assigned to a detection voltage and the abscissa is assigned to time, and a wave form A2 shows a wave form from the acceleration vibrational sensor and a wave form B2 shows a wave form from the elastic wave sensor.

As shown in FIG. 4, noise (111) occurs in the wave form A2, but no anomaly cannot be detected at time (444) when the chip of substrate 1 strikes. In contrast to this, it is found that detection is achieved of an anomaly upon striking of the chip from substrate 1 to chamber 9 in the wave form B2 from elastic wave sensor 4 with no sign of generation of noise detected.

This is because elastic wave sensor 4 of the present invention, as described in the above embodiments, detects a wave without having influences of miscellaneous mechanical sounds and noise in the surrounding environment. The result shown in FIG. 4 shows that according to the present invention, detection can also be ensured of a small chip in addition to the effect described in the third embodiment, thereby enabling more precise detection of an anomaly.

Fifth Embodiment

Figure 5:
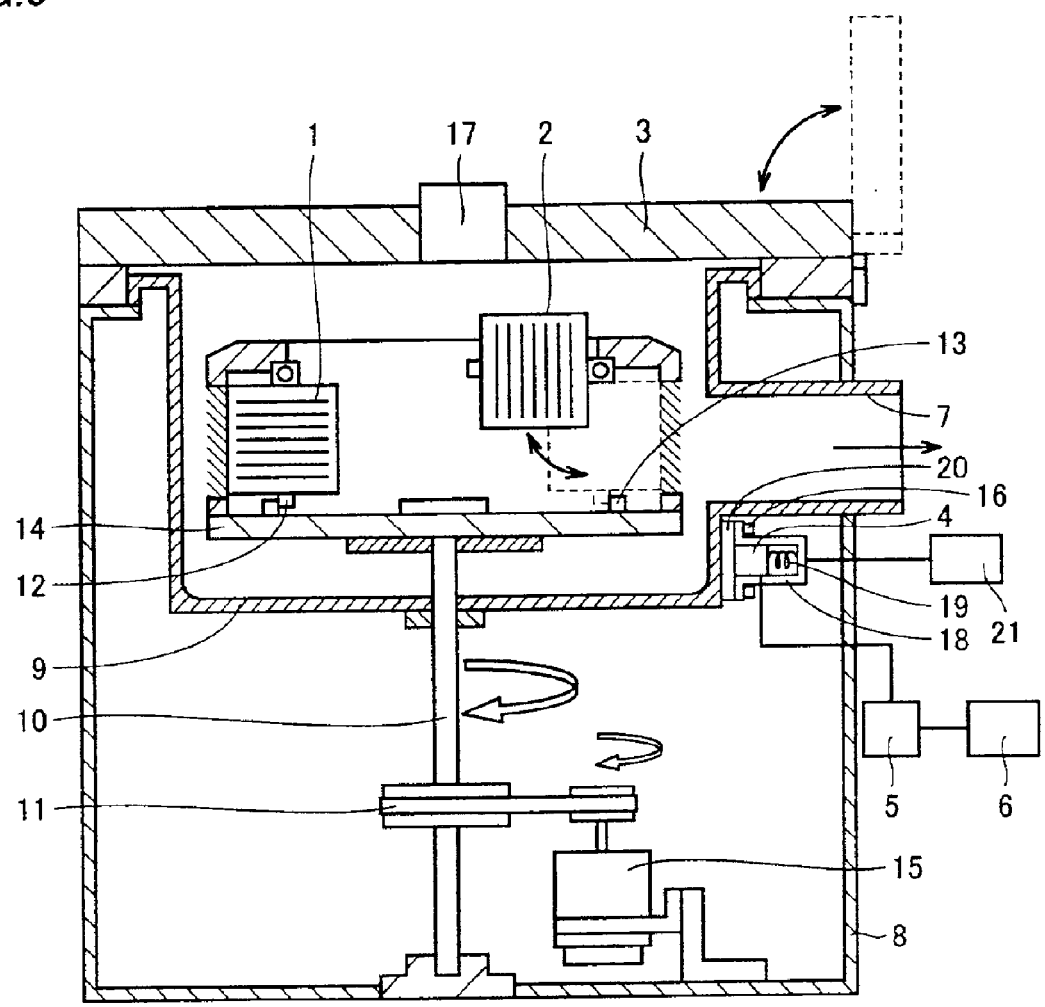
FIG. 5 is a sectional view showing another example of centrifugal dryer of the present invention.

In FIG. 5, there is shown another example of centrifugal dryer according to the present invention. A feature of a fifth embodiment is a mounting section for an elastic wave sensor 4. The other parts of the construction is similar to those of the first embodiment.

As shown in FIG. 5, elastic wave sensor 4 is mounted to the outside wall of chamber 9 in a state that sensor 4 is accommodated in a holder 18 having an opening at one end. Threaded holes for fixing are formed in the outside wall of chamber 9 and plate 20 in advance and thereafter, plate 20 is fixed on the outside wall of chamber 9 with a double coated tape and epoxy resin, for example. Holder 18 has a flange surrounding the opening at the one end and the flange also has threaded holes therein.

Elastic wave sensor 4 is accommodated in holder 18 with a spring 19 inserted in a space therebetween and the flange of folder 18 is put into contact with plate 20 to, in this state, fix holder 18 to plate 20 and chamber 9 using fixing screws 16. Thereby, mounting of elastic wave sensor 4 is completed.

When an elastic wave sensor 4 is take out, it is only required that fixing screws 16 are unscrewed to move elastic wave sensor 4 out of holder 18. Therefore, elastic wave sensor 4 is also maintained with ease.

While in the above embodiment, description is presented of the case where an elastic wave detection system of the present invention is installed in a centrifugal dryer, an elastic wave detection system of the present invention can also be installed in other semiconductor manufacturing apparatuses.

According to the present invention, since it can be detected that a chip of a substrate strikes the chamber (a processing chamber), occurrence of an anomaly can be detected. At this time, since in the present invention, an elastic wave generating upon striking of a chip of a substrate to the chamber is detected, detection is ensured of a wave without having influences of miscellaneous mechanical sounds and noise in the surrounding environment. Therefore, a chance of detection of noise can be reduced compared with a case of use of an acoustic sensor or a vibration sensor. In company with this advantage, not only are a function of complex steps associated circuitry and so on for correction of noise useless to make error detection control easy, but reduction in chance of wrong detection of error is also enabled. As a result, machine related troubles can be quickly solved and an availability factor is ameliorated, thereby enabling a swift response to a quality trouble.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A centrifugal dryer comprising:

a chamber for performing drying processing for plural substrates;

a rotary object, installed inside said chamber, and drying said substrates by rotation driving in a state of being held therein; and elastic wave detection means for detecting an elastic wave transmitted along a wall of said chamber, the elastic wave generating upon striking of a chip from said substrates to said chamber during said processing said substrates, wherein the elastic wave detection means uses a speed component having a resonance point in the frequency range of 50 kHz to 500 kHz.

2. A centrifugal dryer comprising:
   a chamber for performing drying processing for plural substrates;
   a rotary object, installed inside said chamber, and drying said substrates by rotation driving in a state of being held therein; and
   elastic wave detection means for detecting an elastic wave generating upon striking of a chip from said substrates to said chamber during said processing said substrates, wherein said elastic wave detection means includes an elastic wave detection sensor, and said elastic wave detection sensor is installed on an outside wall of said chamber.

3. The centrifugal dryer according to claim 2, further comprising: elastic wave detection frequency adjustment means adjusting a detection frequency for said elastic wave.

4. The centrifugal dryer according to claim 2 wherein a detection frequency for said elastic wave is variable in the range of from 50 kHz to 500 kHz.

5. The centrifugal dryer according to claim 2, wherein a detection frequency region for said elastic wave is set in advance.

6. The centrifugal dryer according to claim 2, further comprising: an arithmetic-logic section inputted with a signal from said elastic wave detection means to output detection of an anomaly.

7. The centrifugal dryer according to claim 6, further comprising: announcement means announcing an error upon detection of an anomaly.

8. The centrifugal dryer according to claim 6, further comprising: substrate processing interruption means for interrupting processing of said substrates upon detection of an anomaly.

9. A manufacturing method for a semiconductor device, characterized by performing drying processing for a substrate using a centrifugal dryer according to claim 1.

10. A semiconductor manufacturing apparatus comprising:
    a chamber for performing processing for a substrate;
    substrate processing means, installed inside said chamber, and for performing said processing for said substrate; and
    elastic wave detection means for detecting an elastic wave transmitted along a wall of said chamber, the elastic wave generating upon striking of a chip from said substrate to said chamber during said processing for said substrate, wherein the elastic wave detection means includes an elastic wave detection sensor, and said elastic wave detection sensor is installed on an outside wall of said chamber.

* * * * *